(12) United States Patent
Jo et al.

(10) Patent No.: US 10,861,996 B2
(45) Date of Patent: Dec. 8, 2020

(54) NEAR-INFRARED LIGHT SENSORS INCLUDING 2-DIMENSIONAL INSULATOR

(71) Applicants: Samsung Electronics Co., Ltd., Suwon-si (KR); Research & Business Foundation SUNGKYUNKWAN UNIVERSITY, Suwon-si (KR)

(72) Inventors: Sanghyun Jo, Seoul (KR); Heejun Yang, Seoul (KR); Geunwoo Hwang, Gimcheon-si (KR); Hyeonjin Shin, Suwon-si (KR)

(73) Assignees: Samsung Electronics Co., Ltd., Gyeonggi-do (KR); Research & Business Foundation Sungkyunkwan University, Gyeonggi-do (KR)

( * ) Notice: Subject to any disclaimer, the term of this patent is extended or adjusted under 35 U.S.C. 154(b) by 0 days.

(21) Appl. No.: 16/232,489

(22) Filed: Dec. 26, 2018

(65) Prior Publication Data

US 2019/0252569 A1  Aug. 15, 2019

(30) Foreign Application Priority Data

Feb. 13, 2018 (KR) .................... 10-2018-0018071

(51) Int. Cl.
*H01L 31/112* (2006.01)
*H01L 31/109* (2006.01)
(Continued)

(52) U.S. Cl.
CPC .............. *H01L 31/109* (2013.01); *G06K 9/00* (2013.01); *H01L 31/022466* (2013.01);
(Continued)

(58) Field of Classification Search
CPC ... H01L 31/032; H01L 31/109; H01L 31/112; H01L 31/0224; H01L 31/0324; H01L 31/022466; H01L 31/101; H01L 31/1136
(Continued)

(56) References Cited

U.S. PATENT DOCUMENTS 6,682,960 B1   1/2004  Mochizuki
9,704,956 B2   7/2017  Shepard et al.
(Continued)

FOREIGN PATENT DOCUMENTS

KR   10-1698820 B1    1/2017
KR   2017-0130646 A  11/2017

OTHER PUBLICATIONS

Jiadan Lin et al, "Plasmonic enhancement of photocurrent in $MoS_2$ field-effect-transistor", APL, 102, 2031109, 2013.
(Continued)

*Primary Examiner* — Chuong A Luu
(74) *Attorney, Agent, or Firm* — Harness, Dickey & Pierce, P.L.C.

(57) ABSTRACT

A near infrared light sensor includes a 2D material semiconductor layer on a substrate, a tunneling layer on the 2D material semiconductor layer, and first and second electrodes on opposite edge regions of an upper surface of the tunneling layer. The 2D material semiconductor layer may be a TMDC layer having a thickness in a range of about 10 nm to about 100 nm. The tunneling layer and the substrate may each include hBN.

12 Claims, 2 Drawing Sheets

(51) Int. Cl.
- *H01L 31/032* (2006.01)
- *H01L 31/0224* (2006.01)
- *G06K 9/00* (2006.01)
- *H01L 31/101* (2006.01)
- *H01L 31/113* (2006.01)

(52) U.S. Cl.
CPC ........ *H01L 31/032* (2013.01); *H01L 31/0324* (2013.01); *H01L 31/101* (2013.01); *H01L 31/1129* (2013.01); *H01L 31/1136* (2013.01)

(58) Field of Classification Search
USPC .......................................................... 257/21
See application file for complete search history.

(56) References Cited

U.S. PATENT DOCUMENTS

2012/0301816 A1* 11/2012 Lee .................... H01M 4/96
429/523
2015/0122315 A1* 5/2015 Shin ...................... C01G 27/00
136/255
2017/0243913 A1 8/2017 Lee et al.

OTHER PUBLICATIONS

Ya-Qing Bie et al., "A MoTe$_2$-based light-emitting diode and photodetector for silicon photonic integrated circuits", Nano Letter vol. 12, Oct. 23, 2017.

Bumsu Lee et al., "Electrical tuning of exciton-plasmon polariton coupling in monolayer MoS$_2$ integrated with plasmonic nanoantenna lattice".

Feng Wang et al., Strong electrically tunable MoTe$_2$/graphene van der Waals heterostructures for high-performance electronic and optoelectronic devices, Appl. Phys. Letter, 109, 193111 (2016).

Busmu Lee, "Fano resonance and spectrally modified photoluminescence enhancement in monolayer MoS$_2$ integrated with plasmonic nanoantenna array".

* cited by examiner

NEAR-INFRARED LIGHT SENSORS INCLUDING 2-DIMENSIONAL INSULATOR

CROSS-REFERENCE TO RELATED APPLICATION

This application claims the benefit, under 35 U.S.C. § 119, of Korean Patent Application No. 10-2018-0018071, filed on Feb. 13, 2018, in the Korean Intellectual Property Office, the disclosure of which is incorporated herein in its entirety by reference.

BACKGROUND

1. Field

The present disclosure relates to near-infrared light sensors including a 2-dimensional insulator.

2. Description of the Related Art

Recently, as the technique of mobile payment has been commercialized, security technology has been improved. As security technology, biometrics such as iris recognition have been studied. In the case of silicon-based image sensors that are currently commercialized, quantum efficiency with respect to a near-infrared ray (NIR) having a wavelength of 800 nm to 900 nm is approximately 30%. Since the quantum efficiency of NIR is in a level from ½ to ⅓ of a visible light band, a low illumination sensitivity of silicon-based image sensors is reduced. Accordingly, when silicon-based image sensors are used for iris recognition in a low illumination environment, an additional light source is needed since the sensitivity of the image sensor is low. However, if a high power light source is used, an eyeball may be damaged.

In the case of the silicon-based image sensor of the related art, it is necessary to increase a thickness of silicon to improve the low illumination sensitivity of the image sensor. As a result, the size of a pixel is increased, and thus, the size of a camera including the image sensor is increased.

In the case of a light detection and ranging (LiDAR) sensor, a 3D sensor, and a low illumination sensor, high photoelectric conversion efficiency is required since the LiDAR sensor, the 3D sensor, and the low illumination sensor should detect a weak optical signal. In order to use a silicon-based image sensor of the related art in a low illumination environment, the increase in the sizes of a pixel and the increase in a thickness of an optical detecting layer is needed.

Recently, many studies have been conducted in relation to the development of an optical device using a transition metal dichalcogenide (TMDC), which has a very high optical absorption rate per unit thickness. However, a sensor structure having favorable characteristics of photo-responsivity, dark current, and response time is limited. Therefore, there is a need to develop a sensor having improved characteristics of photo-responsivity, dark current, and response time.

SUMMARY

Some example embodiments provide one or more near-infrared light sensors having an improved dark current characteristic.

Additional aspects will be set forth in part in the description which follows and, in part, will be apparent from the description, or may be learned by practice of the presented example embodiments.

According to some example embodiments, a near infrared light sensor may include a two-dimensional (2D) material semiconductor layer on a substrate, a tunneling layer on the 2D material semiconductor layer, and first and second electrodes on the tunneling layer. The first and second electrodes may be on opposite edge regions of an upper surface of the tunneling layer.

The 2D material semiconductor layer may include a transition metal dichalcogenide (TMDC).

The 2D material semiconductor layer may include $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, $ReSe_2$, or CuS.

The 2D material semiconductor layer may have a thickness in a range of about 10 nm to about 100 nm.

The tunneling layer may include hBN, alumina, or hafnium oxide.

The tunneling layer may have a thickness in a range of about 3 nm to about 10 nm.

The substrate may include hBN.

The near infrared light sensor may further include a gate electrode on the substrate, the gate electrode and the 2D material semiconductor layer on opposite sides of the substrate.

The substrate may have a thickness in a range of about 3 nm to about 10 nm.

Each electrode of the first and second electrodes may include a transparent conductive oxide.

According to some example embodiments, a near infrared light sensor may include a semiconductor layer on a substrate. The semiconductor layer may include $MoTe_2$. The substrate may include hBN. The near infrared light sensor may include a tunneling layer on the semiconductor layer. The tunneling layer may include hBN. The near infrared light sensor may include first and second electrodes on the tunneling layer. The first and second electrodes may be opposite edge regions of an upper surface of the tunneling layer.

The semiconductor layer may have a thickness in a range of about 10 nm to about 100 nm.

The tunneling layer may have a thickness in a range of about 3 nm to about 10 nm.

The near infrared light sensor may include a gate electrode on the substrate. The gate electrode and the semiconductor layer may be on opposite sides of the substrate.

The substrate may have a thickness in a range of about 3 nm to about 10 nm.

Each electrode of the first and second electrodes may include a transparent conductive oxide.

BRIEF DESCRIPTION OF THE DRAWINGS

These and/or other aspects will become apparent and more readily appreciated from the following description of the example embodiments, taken in conjunction with the accompanying drawings in which.

DETAILED DESCRIPTION

Figure 1:
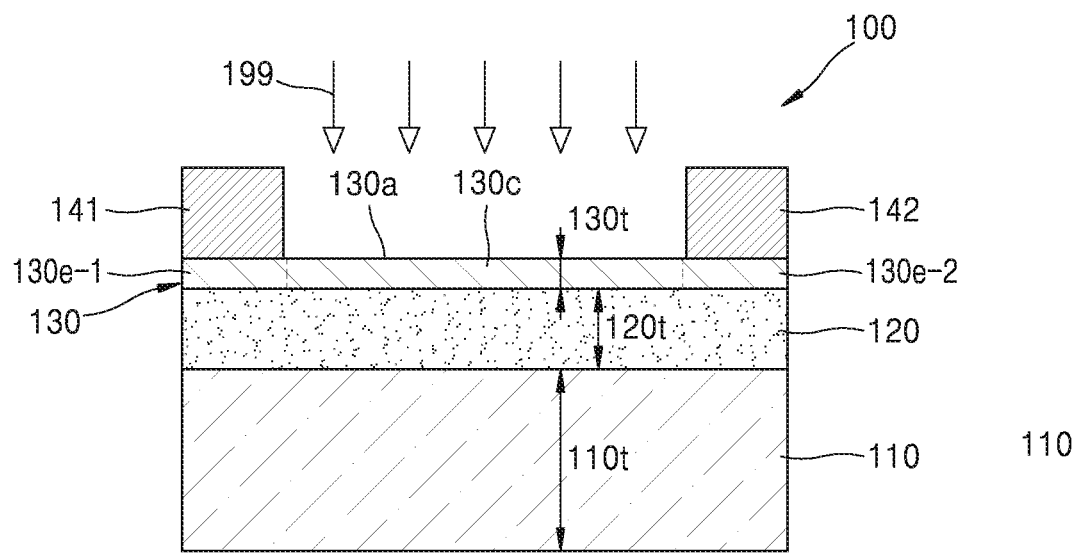
FIG. 1 is a schematic cross-sectional view of a configuration of a near infrared light sensor according to some example embodiments of the inventive concepts.

Hereinafter, example embodiments of the inventive concepts will now be described in detail with reference to the accompanying drawings. In the drawings, thicknesses of layers or regions are exaggerated for clarity of specification. The embodiments of the inventive concepts are examples and capable of various modifications and may be embodied in many different forms.

It will be understood that when an element or layer is referred to as being "on" or "above" another element or layer, the element or layer may be directly on another element or layer or intervening elements or layers.

FIG. 1 is a schematic cross-sectional view of a configuration of a near infrared light sensor 100 according to some example embodiments of the inventive concepts. The near infrared light sensor 100 may include a few millions of pixels, and FIG. 1 shows one of the pixels of the near infrared light sensor 100.

Referring to FIG. 1, the near infrared light sensor 100 may include a two-dimensional (2D) material semiconductor layer 120 and a tunneling layer 130, which are sequentially formed on a substrate 110. Restated, the 2D material semiconductor layer 120 is on the substrate 110, and the tunneling layer 130 is on the substrate 110, and the tunneling layer 130 is on the 2D material semiconductor layer 120. The 2D material semiconductor layer 120 is formed directly on the substrate 110, and the tunneling layer 130 may be formed directly on the 2D material semiconductor layer 120. First and second electrodes 141 and 142 may be respectively formed on both sides of the tunneling layer 130. Restated, and as shown in at least FIG. 1, the first and second electrodes 141 and 142 may be on the tunneling layer 130, such that the first and second electrodes 141 and 142 are on opposite edge regions 130e-1 and 130e-2 (also referred to herein as simply "edges") of an upper surface 130a of the tunneling layer 130. As shown in FIG. 1, a near infrared ray ("near infrared light beam" 199) may be irradiated on a central portion 130c of the tunneling layer 130 that is between the opposite edge regions 130e-1 and 130e-2 on which the first and second electrodes 141 and 142 are located.

Where an element is described as being "on" another element, it will be understood that the element may be "above" or "beneath" the other element. Additionally, an element that is "on" another element may be "directly" on the other element, such that the element contacts at least a portion of the other element, or may be "indirectly" on the other element, such that the element is isolated from contacting the other element by an interposing element, empty space, or combination thereof.

The 2D material semiconductor layer 120, which may be interchangeably referred to herein as simply a "semiconductor layer," generates carriers when the 2D material semiconductor layer 120 receives a near infrared ray of a wavelength of approximately 800 nm to 900 nm. The 2D material semiconductor layer 120 may be a channel for passing the carriers. The 2D material semiconductor layer 120 is a layer that transforms received light into an electrical signal. The 2D material semiconductor layer 120 may have a bandgap of approximately 1 eV at which the 2D material semiconductor layer 120 may well absorb a near infrared ray. The 2D material semiconductor layer 120 may have a layer structure including one or more transition metal di-chalcogenides (TMDC). Restated, the 2D material semiconductor layer 120 may include a transition metal di-chalcogenide (TMDC) monolayer (also referred to herein as simply a transition metal di-chalcogenide (TMDC)). The 2D material semiconductor layer 120 may include a plurality of TMDC monolayers as a stack of such monolayers. The TMDC may include one of transition metals, such as Mo, W, Nb, V, Ta, Ti, Zr, Hf, Tc, Re, and Cu and one of chalcogen elements, such as S, Se, and Te. The TMDC may include $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, $ReSe_2$, or CuS. Accordingly, for example, the 2D material semiconductor layer 120 may include $MoTe_2$. Materials described above are only examples, and besides the materials above, other materials may also be used as the TMDC materials.

The 2D material semiconductor layer 120 may have a thickness 120t in a range of about 10 nm to about 100 nm. If the thickness 120t of the 2D material semiconductor layer 120 is less than 10 nm, an amount of light absorption is small. Therefore, a near infrared light sensor that includes a 2D material semiconductor layer having a thickness less than 10 nm may be difficult to perform as a sensor. If the thickness of the 2D material semiconductor layer 120 is greater than 100 nm, a size of the near infrared light sensor 100 may be increased, and thus, it may not be used as a small near infrared light sensor. The thickness of the 2D material semiconductor layer 120 may be in a range from about 20 nm to about 50 nm.

The tunneling layer 130 includes a two-dimensional (2D) insulator. The 2D insulator may include hexagonal boron nitride (hBN), alumina, or hafnium oxide. For example, the tunneling layer 130 may include hBN. The tunneling layer 130 may have a thickness 130t in a range of about 3 nm to about 10 nm. If the thickness of the tunneling layer 130 is less than 3 nm, a dark current may be increased. If the thickness of the tunneling layer 130 is greater than 10 nm, a tunneling current may be small, and thus, light detectivity may be reduced.

If the tunneling layer 130 includes hBN, a dangling bond is hardly present on a surface of the tunneling layer 130 and a defect state inside a bandgap of the tunneling layer 130 is very small, and thus, a dark current is hardly generated in the near infrared light sensor 100 that uses hBN as the tunneling layer 130.

Each electrode of the first and second electrodes 141 and 142 may include a general metal or a transparent conductive oxide. The general metal may be at least one selected from the group consisting of Al, Cu, Ti, Au, Pt, Ag, and Cr, but the general metal according to the example embodiments are not limited thereto.

The transparent conductive oxide may include at least one selected from the group consisting of, for example, indium tin oxide (ITO), indium zinc oxide (IZO), ZnO, $SnO_2$, antimony-doped tin oxide (ATO), Al-doped zinc oxide (AZO), gallium-doped zinc oxide (GZO), $TiO_2$, and fluorine-doped tin oxide (FTO), but the transparent conductive oxide according to the example embodiments are not limited thereto.

The substrate 110 may have a thickness 110t in a range of about 3 nm to about 10 nm. The substrate 110 may include a generally used insulating material, for example, silicon, glass, plastic, etc. The substrate 110 may include hBN. When the substrate 110 including hBN is used, resistance to carriers passing through the 2D material semiconductor layer 120 is low, and thus, the mobility of the carriers in the 2D material semiconductor layer 120 is increased. As a result, the photo-detection effect is increased, the sensitivity of the near infrared light sensor 100 is increased, and the photo-responsivity of the near infrared light sensor 100 is increased since recombination of electrons and holes generated in the 2D material semiconductor layer 120 is reduced.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

When light of a near infrared wavelength spectrum (e.g., near infrared light beam 199) is irradiated onto an upper surface of the near infrared light sensor 100, that is, onto the tunneling layer 130 as shown in FIG. 1, the irradiated near infrared light beam 199 generates electron-hole pairs in the 2D material semiconductor layer 120 after passing through the tunneling layer 130. The generated electron-hole pairs are separated into electrons and holes. The separated electrons move towards one of the first and second electrodes 141 and 142 to which a higher potential voltage is applied, and accordingly, a tunneling current that passes through the tunneling layer 130 is generated. By measuring this tunneling current, an amount of light of a near infrared wavelength spectrum irradiated on a corresponding pixel of the near infrared light sensor 100 may be detected.

Figure 2:
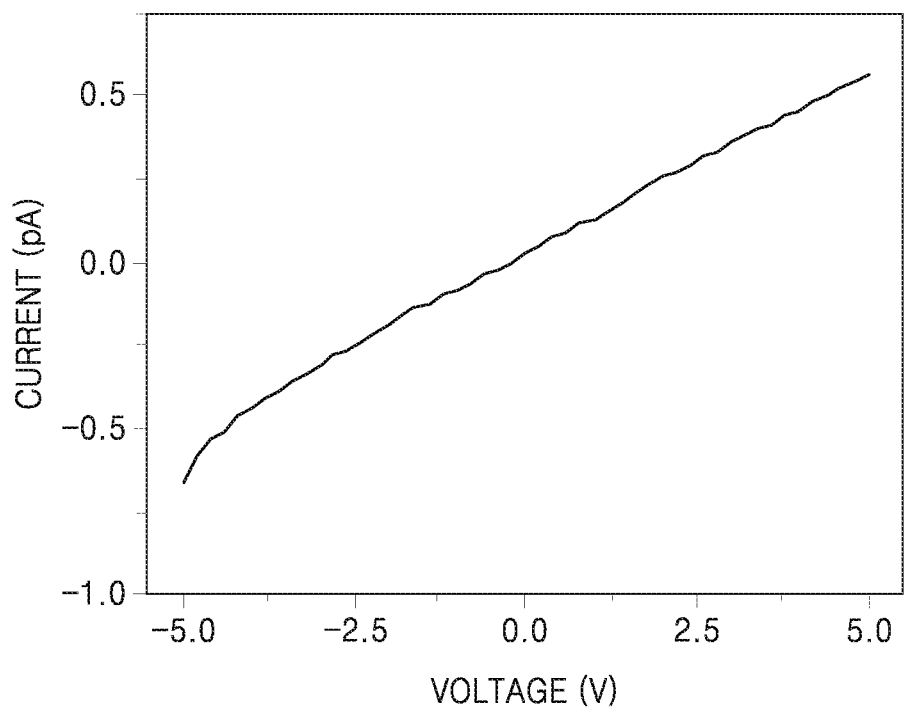
FIG. 2 is a graph showing a dark current of a near infrared light sensor according to some example embodiments of the inventive concepts.

FIG. 2 is a graph showing a dark current of a near infrared light sensor 100 according to some example embodiments of the inventive concepts. In some example embodiments, a MoTe$_2$ layer (e.g., a 2D material semiconductor layer 120 that includes MoTe$_2$) having a thickness of 50 nm is used as the 2D material semiconductor layer 120 of the near infrared light sensor 100, and an hBN layer having a thickness of 5 nm is used as the tunneling layer 130. In some example embodiments, the substrate 110 is formed of ("at least partially comprises") hBN. In some example embodiments, the tunneling layer 130 and the substrate 110 may each include hBN. A near infrared wavelength spectrum of 850 nm is used as the near infrared wavelength spectrum. FIG. 2 shows a measured dark current according to a voltage applied between the first and second electrodes 141 and 142 in a dark environment.

Referring to FIG. 2, when a voltage is applied between the first and second electrodes 141 and 142 in a dark environment, a dark current of approximately 0.7 pA or less is detected. When the value of the dark current is converted to unit area, it is 0.7 µA/cm$^2$ or less, and this value of the dark current is a few hundred times lower than a silicon-based near infrared light sensor of the related art.

Figure 3:
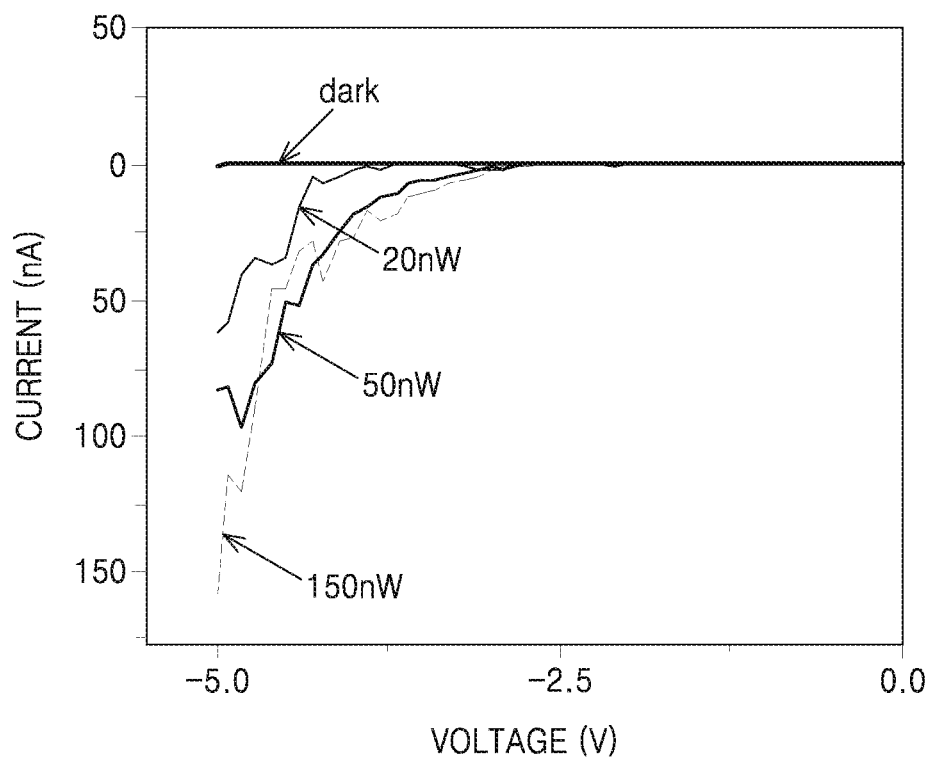
FIG. 3 is a graph showing a reactivity of a near infrared light sensor according to some example embodiments of the inventive concepts.

FIG. 3 is a graph showing a reactivity of a near infrared light sensor 100 according to some example embodiments of the inventive concepts. The configuration of the near infrared light sensor 100 is the same as the configuration of the near infrared light sensor 100 of FIG. 2. FIG. 3 shows optical currents measured in a dark state and states under amounts of light irradiation of 20 nW, 50 nW, and 150 nW.

Referring to FIG. 3, it is known that the dark current in the dark state is a sub-pico ampere, and the optical currents increase as the amount of light of the near infrared wavelength spectrum (irradiation of 850 nm) irradiating the near infrared light sensor 100 increases. The photo-responsivity is 1 A/W or above, which is a favorable photo-responsivity. The near infrared light sensor 100 according to some example embodiments uses the tunneling layer 130 having defectless hBN, and thus, has a low dark current. In some example embodiments, since the near infrared light sensor 100 uses the substrate 110 including hBN, after electron-hole pairs generated by light of the near infrared wavelength spectrum (e.g., near infrared light beam 199) are separated into electrons and holes, the electrons and holes are transferred to the first and second electrodes 141 and 142 without recombination therebetween, and thus, it is seen that the photo-responsivity of the near infrared light sensor 100 is increased. In some example embodiments, a response time of the near infrared light sensor 100 that uses the substrate 110 including hBN is reduced as compared to a near infrared light sensor that uses an oxide substrate of the related art.

In some example embodiments, the near infrared light sensor 100 according to some example embodiments includes the 2D material semiconductor layer 120 having a relatively small thickness, and thus, a camera that employs the near infrared light sensor 100 may be miniaturized.

Figure 4:
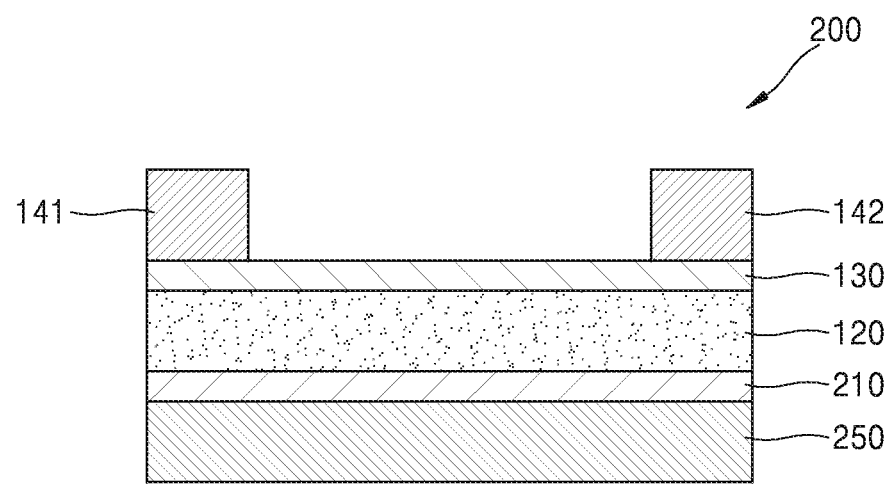
FIG. 4 is a schematic cross-sectional view of a configuration of a near infrared light sensor according to some example embodiments of the inventive concepts.

FIG. 4 is a schematic cross-sectional view of a configuration of a near infrared light sensor 200 according to some example embodiments of the inventive concepts. Like reference numerals are used to indicate elements that are substantially identical to the elements of FIG. 1, and thus, the detailed description thereof will be omitted.

Referring to FIG. 4, the near infrared light sensor 200 may include a gate insulating layer 210, a 2D material semiconductor layer 120, and a tunneling layer 130, which are sequentially formed on a gate electrode 250. In some example embodiments, the gate insulating layer 210 is the substrate 110. As shown in FIG. 4, the gate electrode 250 and the 2D material semiconductor layer 120 may be on opposite sides of the gate insulating layer 210. Accordingly, where the gate insulating layer 210 is the substrate 110, the gate electrode 250 and the 2D material semiconductor layer 120 may be on opposite sides of the substrate 110. The 2D material semiconductor layer 120 is formed directly on the gate insulating layer 210, and the tunneling layer 130 may be formed directly on the 2D material semiconductor layer 120. First and second electrodes 141 and 142 may be formed respectively on both sides of the tunneling layer 130 in contact with the tunneling layer 130. Light of a near infrared wavelength spectrum may be irradiated onto the tunneling layer 130 between the first and second electrodes 141 and 142.

The gate insulating layer 210 may have a thickness in a range of about 5 nm to about 10 nm. The gate insulating layer 210 may include silicon oxide or silicon nitride generally used in semiconductor processes. The gate insulating layer 210 may include a 2D insulator, for example, hBN. When the gate insulating layer 210 including hBN is used, impurities between the 2D material semiconductor layer 120 and the gate insulating layer 210 may be reduced, and thus, a gating effect therebetween may be increased.

The gate electrode 250 may include a general metal. The general metal may be at least one material selected from the group consisting of Al, Cu, Ti, Au, Pt, Ag, and Cr, but the general material according to the example embodiments is not limited thereto.

When a particular (or, alternatively, predetermined) voltage is applied to the gate electrode 250, charges in the 2D material semiconductor layer 120 move towards the gate electrode 250, and thus, an optical absorption in the 2D material semiconductor layer 120 may be increased. Accordingly, a photo-responsivity of the near infrared light sensor 200 is increased. The tunneling layer 130 reduces a dark current.

The near infrared light sensor according to some example embodiments uses the tunneling layer including a 2D insulator, and thus, a dark current is reduced. In some example embodiments, a photo-responsivity is increased by using a TMDC semiconductor layer in which an amount of optical absorption is increased.

In some example embodiments, the hBN substrate and the hBN gate insulating layer increase the photo-responsivity of the near infrared light sensor.

In some example embodiments, the gate electrode increases the optical absorption in the 2D material semiconductor layer, and thus, the photo-responsivity and response time of the near infrared light sensor may be improved.

While one or more example embodiments have been described with reference to the figures, it will be understood by those of ordinary skill in the art that various changes in form and details may be made therein without departing from the spirit and scope as defined by the following claims.

What is claimed is:

1. A near infrared light sensor, comprising:
   a two-dimensional (2D) material semiconductor layer on a substrate;
   a tunneling layer on the 2D material semiconductor layer; and
   first and second electrodes on the tunneling layer, the first and second electrodes on opposite edge regions of an upper surface of the tunneling layer,
   wherein
      the 2D material semiconductor layer has a thickness in a range of about 10 nm to about 100 nm, and
      the tunneling layer has a thickness in a range of about 3 nm to about 10 nm.

2. The near infrared light sensor of claim 1, wherein the 2D material semiconductor layer includes a transition metal di-chalcogenide (TMDC).

3. The near infrared light sensor of claim 1, wherein the 2D material semiconductor layer includes $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, $ReSe_2$, or CuS.

4. The near infrared light sensor of claim 1, wherein the tunneling layer includes hBN, alumina, or hafnium oxide.

5. The near infrared light sensor of claim 1, wherein the substrate includes hBN.

6. The near infrared light sensor of claim 1, further comprising:
   a gate electrode on the substrate, the gate electrode and the 2D material semiconductor layer on opposite sides of the substrate.

7. The near infrared light sensor of claim 1, wherein the substrate has a thickness in a range of about 3 nm to about 10 nm.

8. The near infrared light sensor of claim 1, wherein each electrode of the first and second electrodes includes a transparent conductive oxide.

9. A near infrared light sensor, comprising:
   a semiconductor layer on a substrate, the semiconductor layer including $MoTe_2$, the substrate including hBN;
   a tunneling layer on the semiconductor layer, the tunneling layer including hBN; and
   first and second electrodes on the tunneling layer, the first and second electrodes on opposite edge regions of an upper surface of the tunneling layer,
   wherein
      the semiconductor layer has a thickness in a range of about 10 nm to about 100 nm, and
      the tunneling layer has a thickness in a range of about 3 nm to about 10 nm.

10. The near infrared light sensor of claim 9, further comprising:
    a gate electrode on the substrate, the gate electrode and the semiconductor layer on opposite sides of the substrate.

11. The near infrared light sensor of claim 10, wherein the substrate has a thickness in a range of about 3 nm to about 10 nm.

12. The near infrared light sensor of claim 9, wherein each electrode of the first and second electrodes includes a transparent conductive oxide.

* * * * *